United States Patent [19]
Hoffman et al.

[11] Patent Number: 5,317,183
[45] Date of Patent: May 31, 1994

[54] SUBSTRATE NOISE COUPLING REDUCTION FOR VLSI APPLICATIONS WITH MIXED ANALOG AND DIGITAL CIRCUITRY

[75] Inventors: Charles R. Hoffman, Raleigh; John M. Mullen, Wake Forest, both of N.C.

[73] Assignee: International Business Machines Corporation, Armonk, N.Y.

[21] Appl. No.: 754,478

[22] Filed: Sep. 3, 1991

[51] Int. Cl.$^5$ .................... H01C 29/76; H01C 29/94; H01C 29/00; G06F 7/38
[52] U.S. Cl. .................................. 257/369; 257/500; 257/392; 307/469; 307/496; 307/451
[58] Field of Search ............... 357/40, 42; 356/226; 257/369, 500, 392; 307/451, 469, 496

[56] References Cited
U.S. PATENT DOCUMENTS
4,672,584  6/1987  Tsuji et al. .................... 365/226

OTHER PUBLICATIONS
"State of the art and Future prospects for Analogue signal Processing . . . "–Temes et al.; 1988; pp. 1655–1659.
"The Design of High-Performance Analog Circuits on Digital CMOS chips"; Vittoz; 1985; pp. 657–665.

*Primary Examiner*—Rolf Hille
*Assistant Examiner*—Wael Fahmy
*Attorney, Agent, or Firm*—Joscelyn G. Cockburn

[57] ABSTRACT

The internal electrical noise generated by circuits of a VLSI chip is controlled by separating the logic circuit substrate contacts from the logic circuits ground contacts. A separate return path interconnects each contact to card ground. Further noise reduction is achieved by providing a void region between the noise generating devices and the "quiet" devices. A substrate contact ring is provided in the void region. The substrate contact ring is connected by a separate path to card ground.

9 Claims, 12 Drawing Sheets

SUBSTRATE NOISE COUPLING REDUCTION FOR VLSI APPLICATIONS WITH MIXED ANALOG AND DIGITAL CIRCUITRY

BACKGROUND OF THE INVENTION

I. Field of the Invention

The invention relates to integrated circuits in general, and in particular, to techniques and devices for reducing electrical noise in VSLI chips.

II. Prior Art

The rapid advance in circuit technology has made it possible for entire systems and subsystems, such as microprocessors, etc., to be implemented on a single chip. A conventional VSLI chip includes a common substrate upon which a multitude of interconnected digital and analog electrical circuits are mounted. Usually, the digital circuits occupy anywhere from 80% to 90% of the chip. The analog circuit occupies the remaining portion of the chip. The analog circuit is usually positioned at the periphery of the chip and interfaces the digital circuitry with the external world. The advantage of combining digital and analog circuits on a single VLSI chip includes lower cost, reliability, performance enhancements, card area reduction, power dissipation reduction, stability design from system to system, etc. Still other reasons and advantages for integrating digital and analog circuits on a common substrate are set forth in the articles "The Design of High-Performance Analog Circuits on Digital CMOS Chips," Eric A. Vittoz, IEEE Journal of Solid State Circuits (ISCC), Vol. SC-20, No. 3, June, 1985 and "State of the Art and Future Prospect for Analogue Signal Processing-A Tutorial," Temes, Gabor C. et al, IEEE Proceedings 1988 ISCAS, pages 1655–1660.

A major problem which limits the use and acceptance of mixed circuit VLSI chips is noise. Digital circuits are inherently noisy. The faster the circuits, the noisier they become. On the other hand, analog circuits are predominately quiet. Digital noise generation is due, in part, to the rapid rate at which the digital components are switched. When digital and analog functions share the same chip, the noise generated by the digital circuits is coupled into the analog circuits. The coupled noise may cause errors in the low amplitude sensitive analog circuits.

The noise problem in digital/analog chips is a complex, phenomenon which is explained in FIGS. 1A through 4.

Figure 1A:
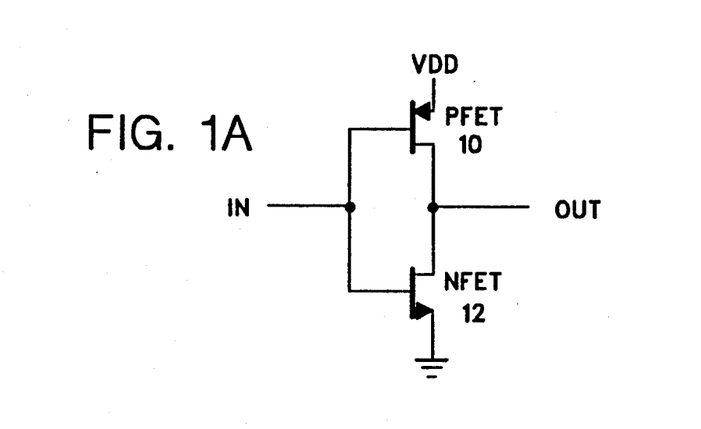
FIG. 1A shows a typical logic circuit output stage.

FIG. 1A shows a typical logic circuit output stage in which PFET 10 is connected to NFET 12. The P-channel FET (PFET) is connected with its source node connected to the positive power supply, (VDD) and its drain node is connected to the output (OUT) node. The N-channel FET has its source node connected to ground (GND), and its drain node connected to the output (OUT) node. The gate node of both devices is common and tied to input node (IN). The bulk region of each device (not shown) is tied to the appropriate power rail (VDD or GND) that provides for device biasing during circuits operation. For the P-channel device, the bulk region is the N-well diffusion (not shown). The N-channel bulk is the substrate, P-type silicon. It should be noted that for a P-well process, the N-channel bulk region would be a P-well and the P-channel bulk, the N-type substrate.

Figure 1B:
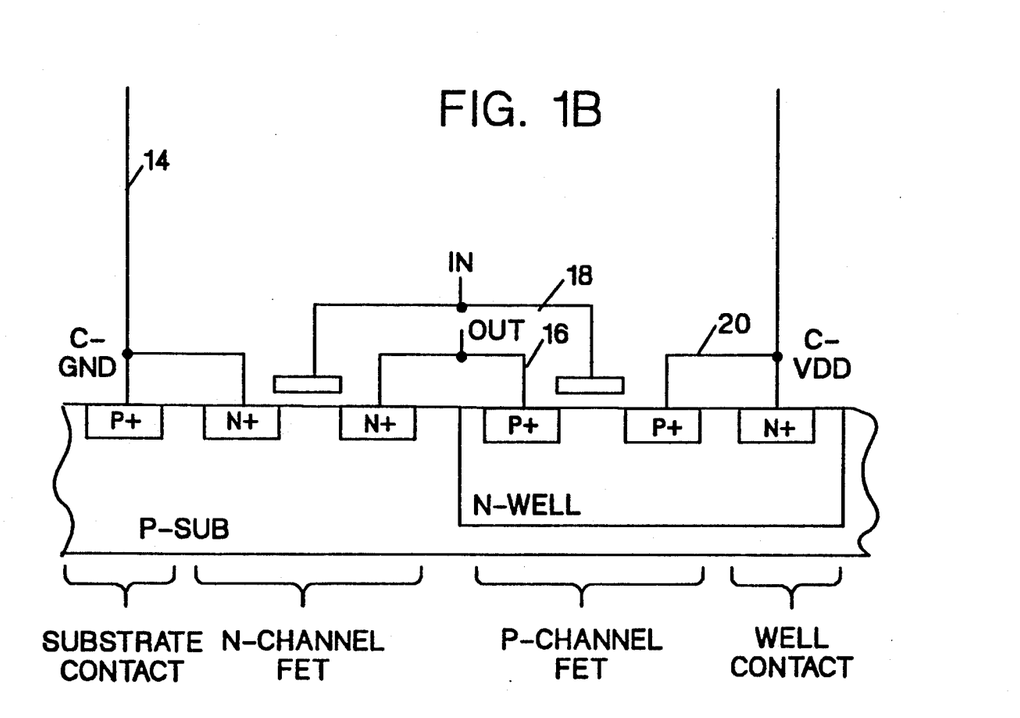
FIG. 1B shows a cross section of the logic circuit output stage.

FIG. 1B shows a cross section of the structure shown in FIG. 1A. The structure includes an N-well in which the P-channel FET is formed, a well contact N+, a substrate contact P+ and the N-channel FET. The N-channel FET N+ source and the (P-Sub) substrate are tied via metal conductor 14 to pin or node C-GND. The node or pin C-GND is the chip ground. The output pin or output node (OUT) is connected by metal conductor 16 to the drain electrodes of P-channel and N-channel device while input node (IN) is coupled by a metal conductor 18 to the gate electrodes of the P and N-channel device. The power supply node on pin C-VDD is connected by a metal conductor 20 to the P+ source and the N-well of the P-channel FET. To minimize the risk of latch-up, substrate and well contacts are located in close proximity to the source contacts of the N-channel and the P-channel FETs. The showing in FIG. 1B represents a CMOS structure in which the close proximity of the source and bulk contacts minimizes the bulk resistance between the emitter and base of the parasitic bipolar transistors in the structure. It should be noted that "pin" and nodes are used synonymously.

Figure 2:
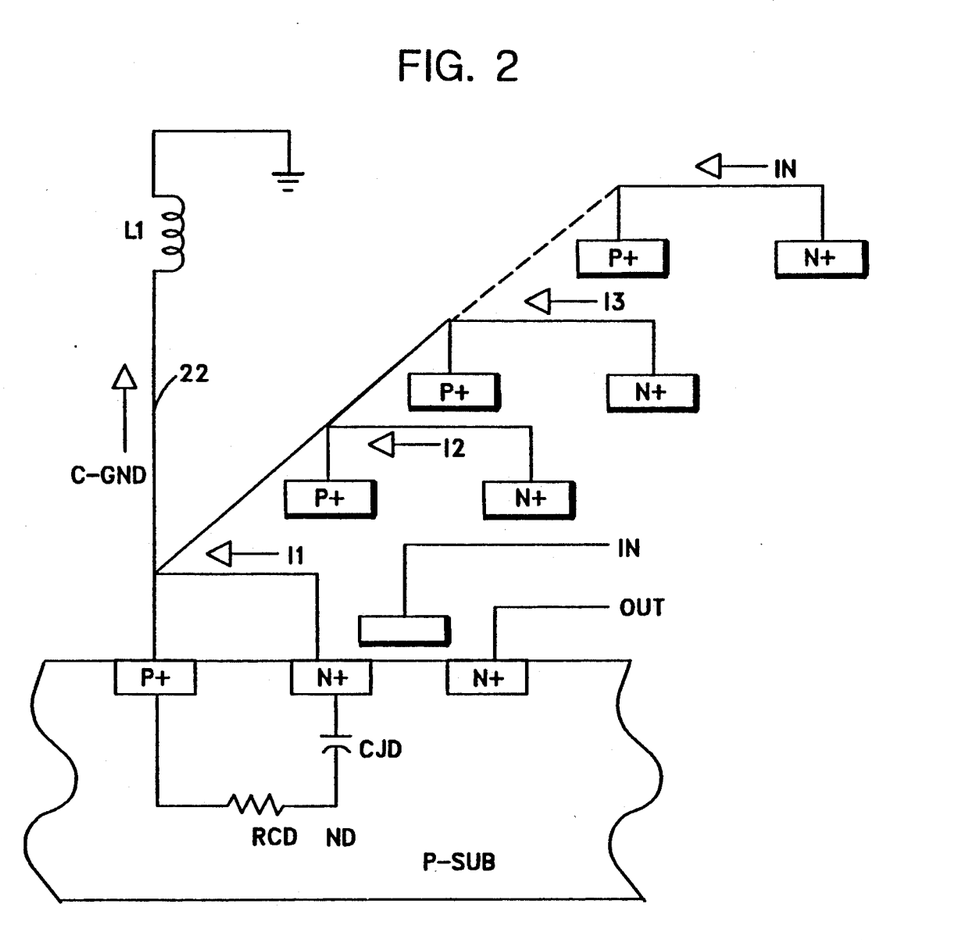
FIG. 2 shows the cross section of a plurality of N-channel devices and the ground current components generated by the devices.

FIG. 2 is a schematic showing a plurality of N-channel devices fabricated on a common P-substrate (P-sub). The figure also shows parasitic circuit components which are formed between the various substrate and device contacts when the chip is in operation. The layout in FIG. 2 is fairly typical and shows the ground current components which contribute to the noise problem of a mixed signal VLSI chip. The chip pin (C-GND) is coupled by metal conductor 22 to the card ground (GND). As a result of this interconnection, a package lead inductance (L1) is between the card ground and the chip ground (C-GND). Also, RCD is the substrate contact resistance formed between substrate (node ND) and the metal at C-GND1 while (CJD) is the P-N junction capacitance formed between the P-sub and the N+ diffusion. Currents I1, I2, I3 through IN are currents which flow into the chip node (C-GND) as a result of the N-channel devices discharging the capacitance load on the output node substrate. The respective arrows indicate direction of current flow.

When the chip is in operation, the current for each digital circuit is summed at chip ground node, C-GND, and flows through the package leads 22 to the card ground GND. The value of L1 represents the effective inductance of the package leads. The value of RCD represents the contact resistance of the substrate contact along with a small amount of resistance caused by the substrate resistivity in the region between the substrate contact and the N-channel diffusions. The value of CJD is the PN junction capacitance of the substrate to diffusion capacitance. The node in the substrate region near the N-channel FET is represented by the symbol ND.

For typical large VLSI chips, there can be several thousand digital circuits that simultaneously switch. Thus, ID which is the summation of current from all FETs on the chip can be very large. Stated mathematically, $$ID = \sum_{j=1}^{j=N} I_j.$$

where I represents current, j and n represent digits.

In addition, due to the fast switching rate of present day VLSI circuitry, the rate of change of the current, di/dt can be very large. When this current transient is forced through L1, the voltage of the chip ground (C-GND) caused by the inductive drop L1×di/dt can be significant (in the 1.5 volts-2.5 volts range for some chips). The change in voltage at (C-GND) is often referred to as ground bounce. Due to the presence of RCD and CJD, the substrate node ND will also experience the ground bounce occurring at the C-GND ground. Stated another way, the instantaneous change in voltage occurring at C-GND is coupled through the substrate to the region ending near the N-channel device. As will be described subsequently, this disturbance (ground bounce) or electrical noise transmitted through the substrate to the analog section of the circuit (to be described and shown subsequently).

Figure 3:
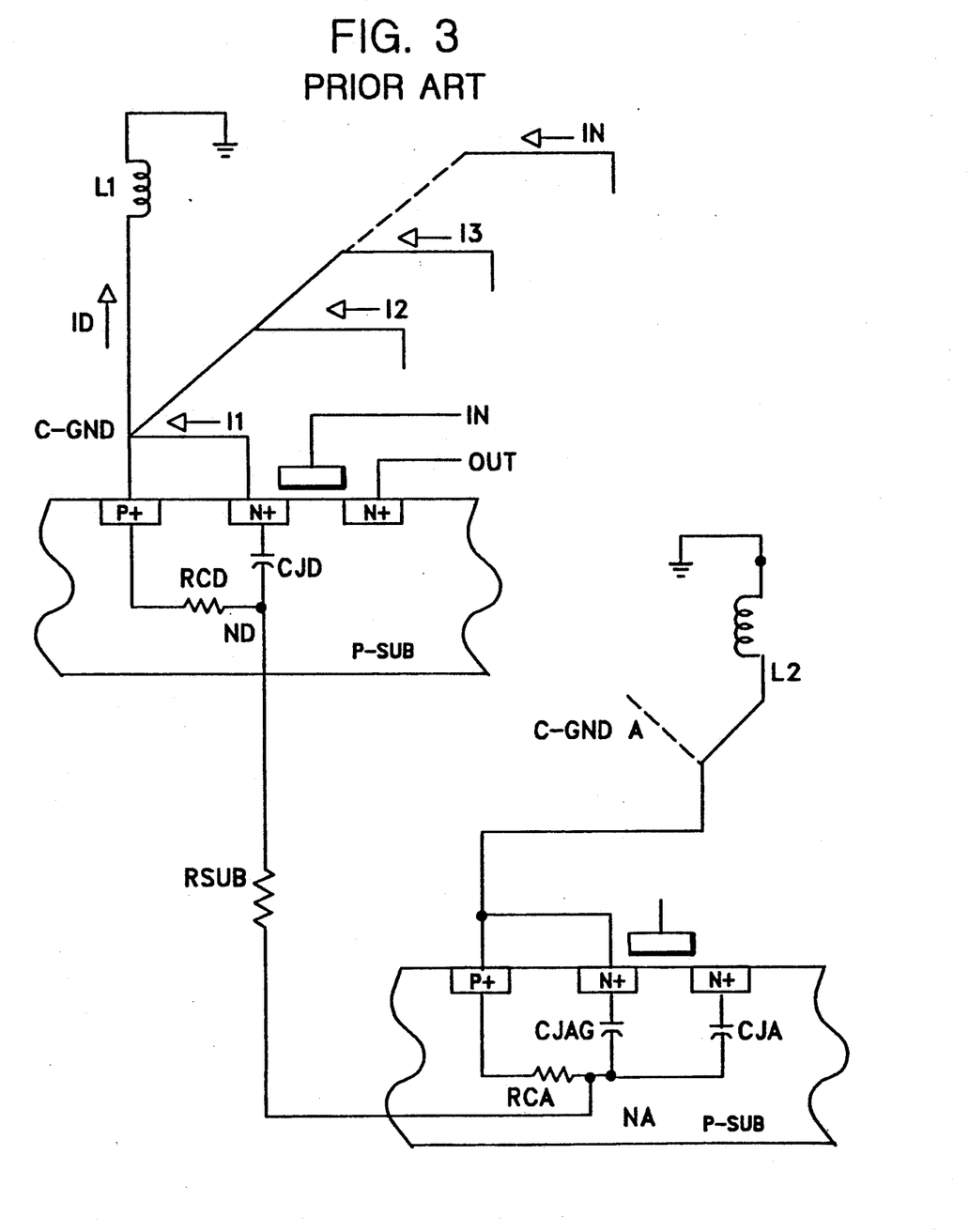
FIG. 3 shows typical cross sections for the digital and analog portions of a chip and the substrate resistive path connecting the two regions.

Turning now to FIG. 3, a typical cross section for the digital and analog portion of a mix chip is shown. The right half of the chip represents the analog section while the left half represents the digital section. The digital cross section of the chip has been described in relationship to FIGS. 1B and 2 above and will not be repeated here. The analog portion of the chip includes an analog substrate contact (P+), an analog ground diffusion node (N+) and an output diffusion node (N+). RCA is the resistance of the analog substrate contact from (C-GNDA) to the NA node. Capacitor CJAG interconnects node NA to the analog ground node (C-GNDA). Capacitor CJA (the P-N junction capacitance) interconnects node NA to the diffusion node (N+). Since the substrate (P-SUB) is common for the analog and digital devices, the digital node ND and analog node NA are connected by a substrate resistance Rsub. Rsub is part of a conductive path interconnecting the digital node ND to the analog node NA. Therefore, any substrate bounce at ND is coupled through R-SUB to NA and is subsequently coupled to the N+ diffusions through the unavoidable junction capacitance CJA.

Figure 4:
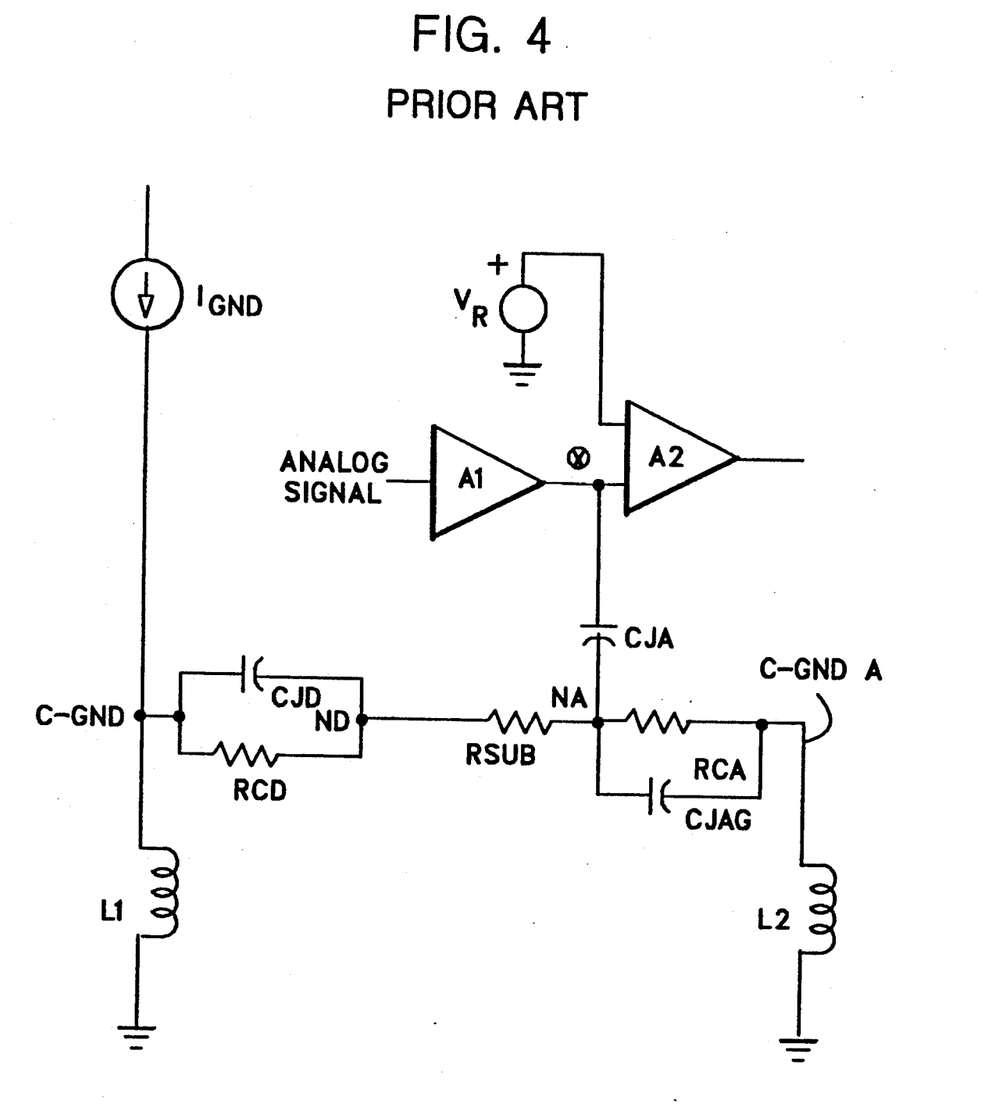
FIG. 4 is a schematic representation of the network path shown in FIG. 3 with additional on-chip analog functions.
Figure 5:
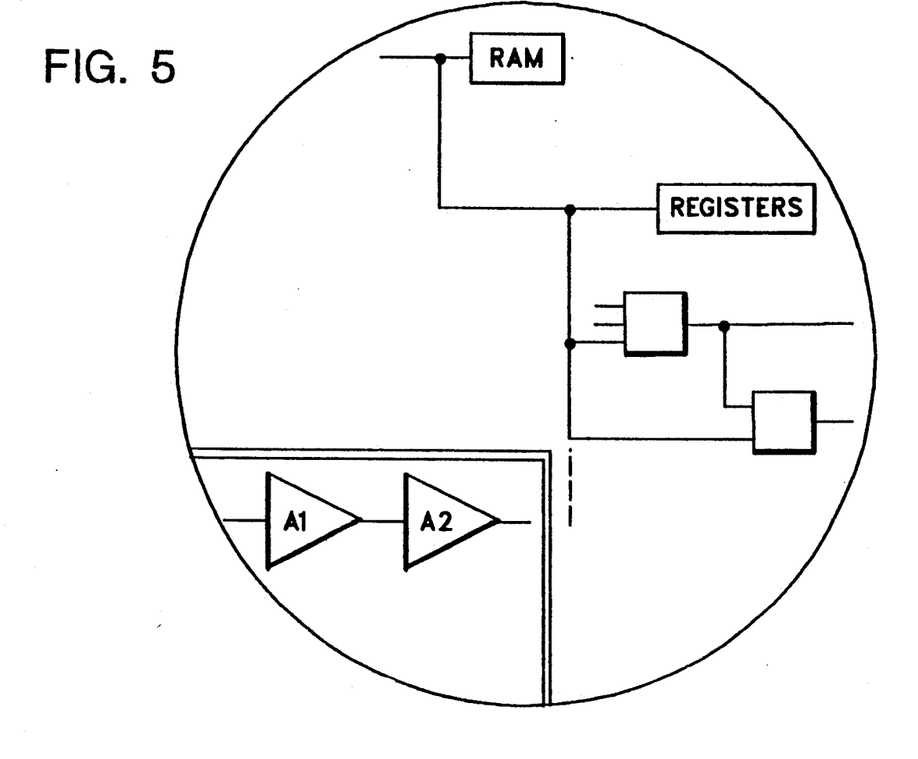
FIG. 5 shows an exploded view of the region circled in FIG. 5A.
Figure 5A:
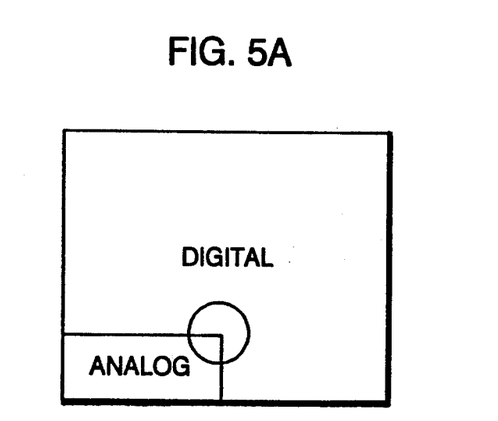
FIG. 5A shows a typical terrain for a chip carrying both analog and digital functions.

FIG. 4 shows an equivalent circuit for the mixed circuit of FIG. 3. As discussed previously, any internal noise ground bounce which is experienced at node ND is coupled through R substrate (R-SUB) and presented to node X. Node X is the junction point for the output from amplifier A1 and an input to amplifier to A2. Amplifiers A1 and A2 are analog circuits on the chip. Also, $V_R$ represents a signal generator. The signal that is being processed through the analog circuit passes through amplifier A1 and appears at node X. $V_R$ is assumed to be an external signal source with a low output impedance. Since the output of the signal generator is low, it can be assumed that $V_r$input is clamped to one leg of the two input amplifier A2. Most on chip CMOS amplifiers have relatively large output impedance. Therefore, noise coupled through the junction capacitors of amplifier A1 output stage will appear at X together with the ground bounce from node ND and amplified through amplifier A2. Thus, the circuit topology in FIG. 4 which is the typical mixed (digital and analog) topology, is plagued with noise at the input of amplifier A2.

It is believed that as VLSI geometry is continued to shrink, more circuits will be placed in a given chip area and the noise environment will become even less favorable to sensitive analog functions on the same chip. The decreasing device dimensions of scaled VLSI will also have an adverse effect on the analog functions. For example, the scaling impact will necessitate a power supply voltage reduction. For a given noise floor, the reduced power supply voltage limits the signal swing.

The lower power supply voltage is required by the scaled digital (now 5 volts going to 3.3 volts) and will greatly reduce the theoretical upper limit of the signal-to-noise ratio. When combined with the increasing noise generated by the denser logic, a decreasing theoretical limit of signal-to-noise ratio gives rise to a double sided squeeze on the analog design. A more detailed discussion of the effect of the decreasing device dimensions on the sensitive analog circuit of a chip is set forth in Cato, K. et al, in an article entitled, "A 300 Megahertz Monolithic Video Current Driver for High Resolution CRT Applications," IEEE JSSC, August 1989, pp. 1110-1117.

The prior art has recognized the noise problem and has suggested corrective techniques. For example, in an article entitled, "Reduced Ground Bounce and Improved Latch-Up Suppression Through Substrate Condition," Gabara, Tadius, IEEE Journal of Solid State Circuits, Vol. 23, No. 5, October 1988 (pgs. 1224-1232), the package lead inductance is reduced by removing approximately half of the I/O bonding wire leads in the power network and connecting the power supply through the substrate. The technique as a noise suppressor is questionable in that the current in the substrate must still flow through the package lead frame inductance and this can result in considerable noise coupling into sensitive analog functions on the chip.

Another technique for reducing lead inductance is set forth in Peddler, D. J. "Interconnection and Packaging of Solid-State Circuits," IEEE JSSC, June 1989, pp. 698-703. In this technique, the flip chip bonding reduces the lead inductance. Flip chip bonding is where the chip is soldered directly to the package, greatly reducing the chip to package inductance, and somewhat reducing the lead frame inductance. Even though the flip chip bonding technique appears attractive, its drawbacks are that it is expensive and it only reduces package inductance but does not eliminate it. In order to utilize low-cost packaging and still achieve good noise immunity, new techniques are needed.

SUMMARY OF THE INVENTION

It is therefore the general object of the present invention to provide a more efficient mixed signal VLSI chip than was heretofore possible.

It is another object of the present invention to provide a quieter mix signal VLSI chip than was heretofore possible.

The improved VLSI chip includes a common substrate upon which digital circuits and analog circuits are fabricated. A contact area is fabricated in the substrate and is connected via a chip metal lead to a first ground pin on the chip. The first ground pin is then connected via a substrate ground return lead to the card ground.

Likewise, the ground contacts for each digital device or circuitry are connected to a second ground pin on the chip. The second ground pin is connected to the card ground by another substrate ground return lead. By separating the digital circuit ground return path from the substrate ground return path, the generated noise, if not eliminated, is significantly reduced. The noise reduction capabilities of this technique are even more pronounced if the substrate is of high resistivity.

Another noise reduction technique inserts a void area between the digital circuits and the analog circuits. A substrate contact zone is fabricated in the void area and is connected by a metal ground lead to the card ground.

The structure is the equivalent of a voltage divider circuit.

The foregoing features and advantages of the invention will be more fully described in the accompanying drawings.

DETAILED DESCRIPTION OF THE PREFERRED EMBODIMENT

Before describing the invention, it is worthwhile to summarize the prior art and to distinguish it from the disclosed invention to be described hereinafter.

FIGS. 1A, 1B, 2 and 3 are graphical representations (circuits and solid state) of prior art configurations. In essence, a common substrate pin (C-GND) forms a single ground return path for the substrate and the devices. With this configuration, a large current $I_D$ flowing through L1 causes the voltage at C-GND to change rapidly (bounce). The general bounce or voltage change is transmitted primarily by $R_{CD}$ to digital node (ND) and is coupled, via the substrate resistance (Rsub) to the analog node (NA).

Figure 7:
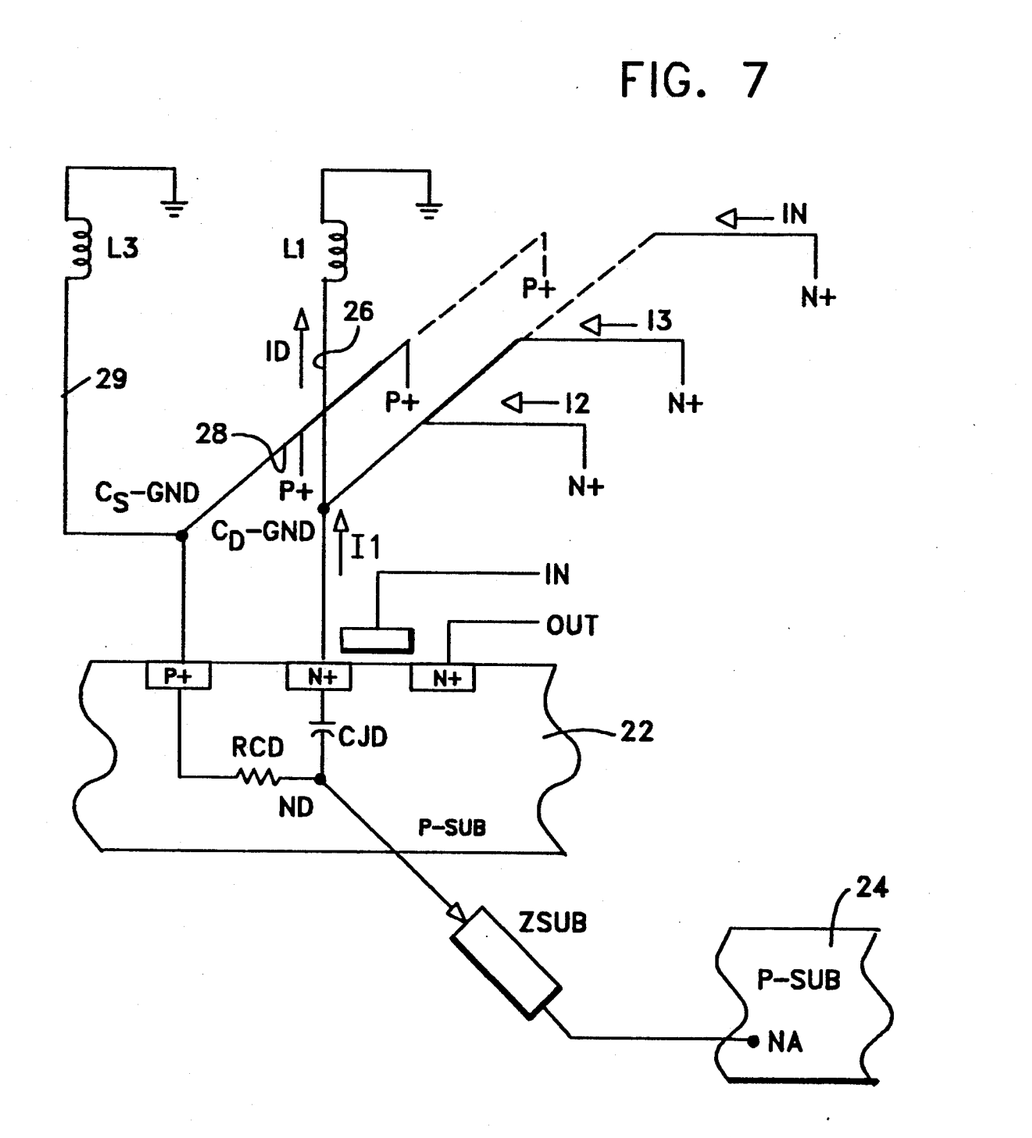
FIG. 7 shows an N-channel cross section of a digital layout according to the teachings of the present invention.

FIG. 7 shows an improved mix chip configuration according to the teachings of the present invention. The mix chip includes a digital section 22, and an analog section 24. A common substrate P-sub supports the analog devices and the digital devices. It should be noted that use of a P-substrate is only for descriptive purposes and should not be used to limit the invention since it is well within the skill of one skilled in the art to use an N-substrate with different types of devices to fabricate a mix chip. Any one of the conventional fabrication processes can be used for preparing the mix chip. By way of example, CMOS technology is an acceptable process that could be used to design the chip according to the teaching of the present invention.

The chip includes a multiplicity of digital devices fabricated on the digital section 22 of the chip and analog devices generated on the analog section 24 of the chip. For brevity, only the N-channel cross section of the digital layout is shown. It being understood that the analog devices in the analog section 24 can be structured as the analog section shown in FIG. 3. A plurality of metal device contacts (N+) for the multiplicity of devices are fabricated on the P-substrate in the digital sector of the chip. Substrate contact P+ for each of the multiplicity of contacts on the chip is also deposited in P-substrate. A ground pin designated $C_{S\text{-}GND}$ for grounding the substrate contacts is provided. Each of the device source contacts N+ is connected to $C_D$-GND pin. As will be explained subsequently, each of the devices generate current $I_1$ through $I_N$ which flows into the pin $C_D$-GND. A conductor 26 interconnects the pin ($C_{D\text{-}GND}$) to card ground. Another module pin $C_S$-GND is connected through conductor 28 to the multiplicity of P+ substrate contacts. The substrate GND return conductor 29 interconnects the $C_S$-GND pin to card ground.

Still referring to FIG. 7, a digital node ND is positioned in the digital section of the chip. Several of these nodes are distributed throughout the digital portion 22 of the chip. Likewise, analog nodes NA are present in the analog portion 24 of the chip. When the chip is in operation, several parasitic structures are distributed between the nodes and pins on the chip. Notable is the substrate impedance $Z_{sub}$ interconnecting nodes ND and NA. Likewise, a resistance $R_{CD}$ interconnects the substrate contact (P+) and node ND. A capacitance $C_{JD}$ interconnects node ND and the diffusion N+. Lead inductor L1 is formed between the device ground pin $C_D$-GND and card ground. Likewise, a lead inductance L3 is formed between the substrate pin ($C_{S\text{-}GND}$) and card ground. A current $I_D$ flows between $C_D$-GND and the card ground. The current $I_D$ is equal to $$\sum_{j=1}^{j=N} I_j$$

This current creates a voltage across L1 and as devices conduct on the chip, the voltage changes and, as a result, node $C_D$-GND bounces but is not coupled directly to $C_S$-GND as was the case in FIG. 3. It should be noted that the current through L3 is substantially low approximating 0 and, as a result, the node at pin $C_S$-GND is relatively stable. As will be explained subsequently, the bounce at pin CD-GND has very little effect on node ND and, as a result, the coupling of the structure according to the teaching of this invention is substantially reduced if not eliminated.

Figure 8:
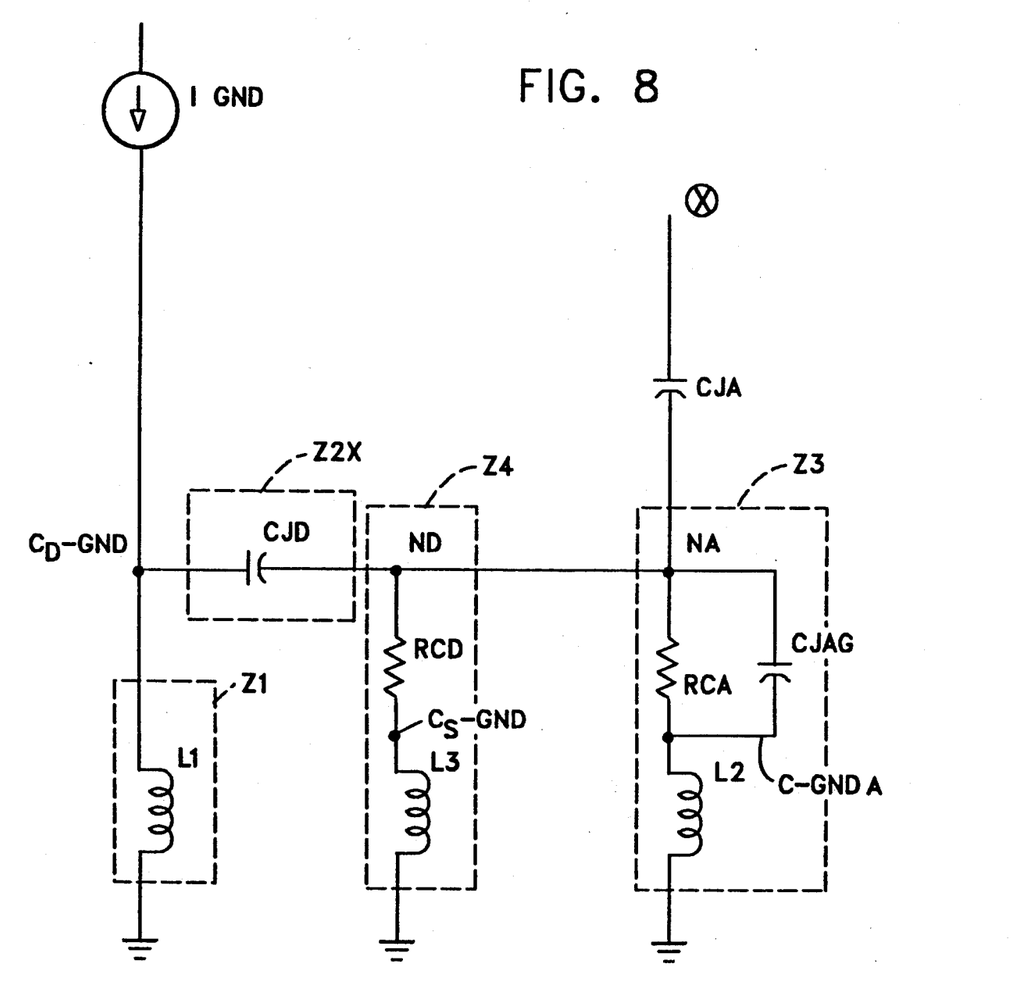
FIG. 8 shows a schematic representation of the substrate network of FIG. 7 for the case where Rsub=0.
Figure 9:
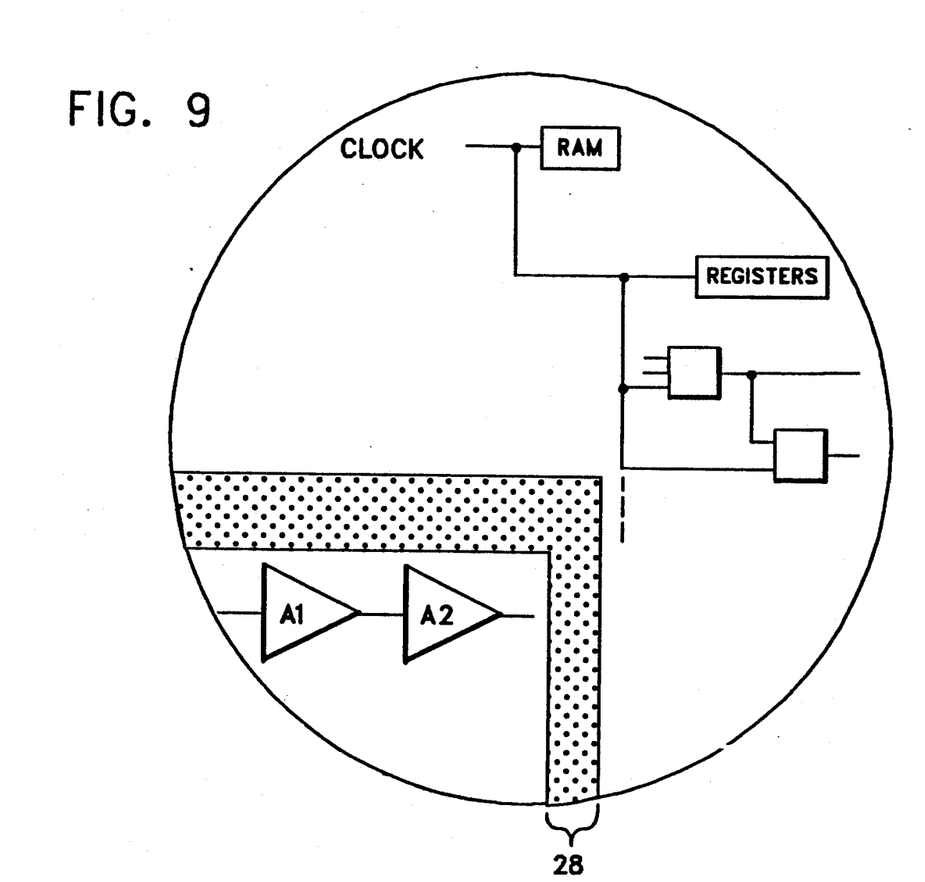
FIG. 9 shows an exploded view of the region circled in FIG. 9A.
Figure 9A:
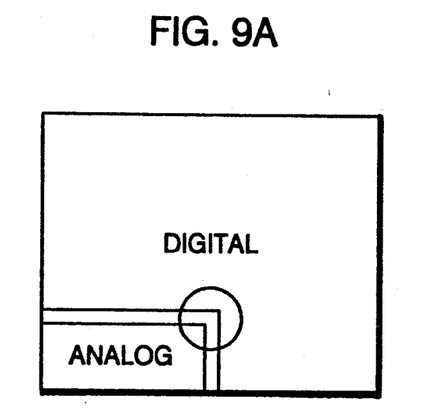
FIG. 9A shows a terrain for a chip carrying analog and digital functions with a void region between the respective functions.
Figure 10:
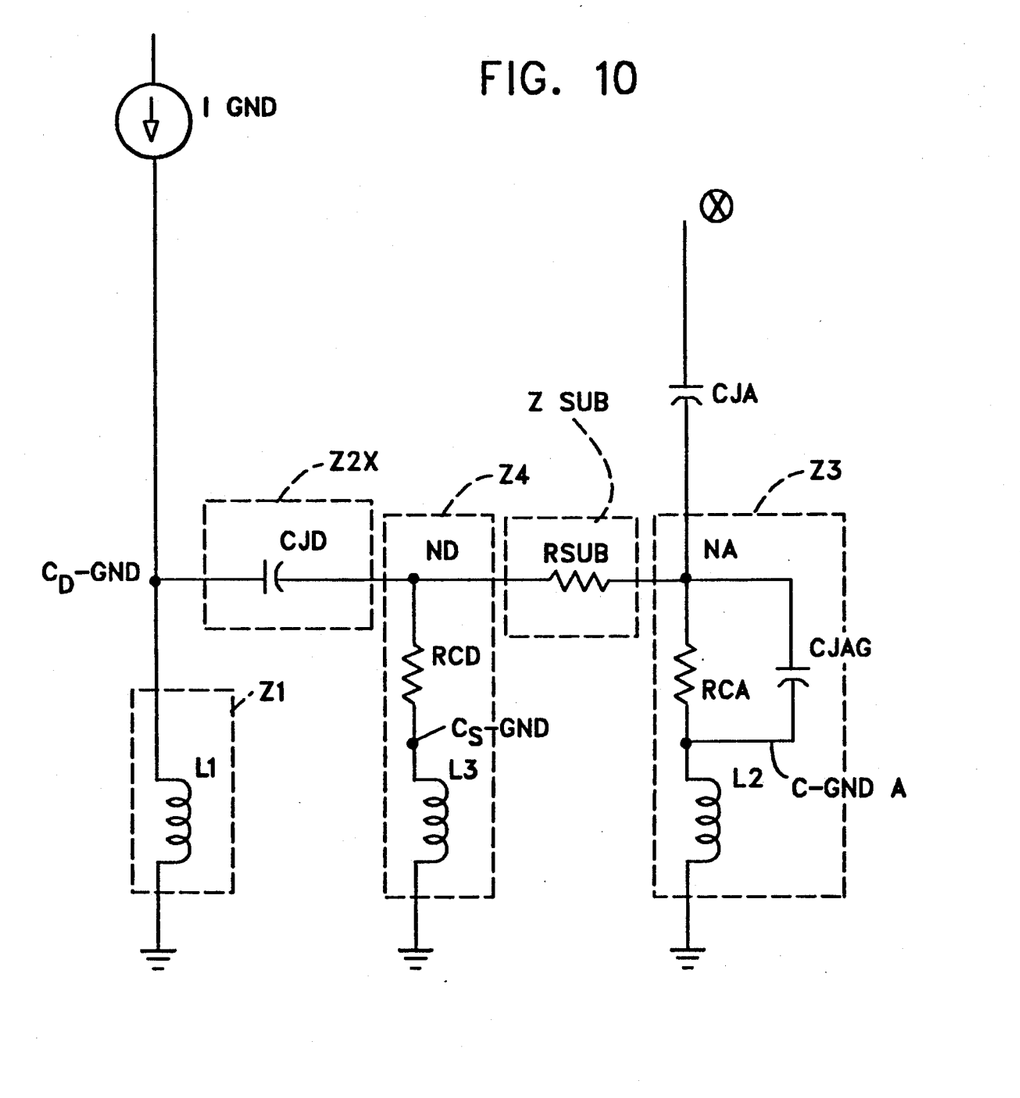
FIG. 10 shows a schematic for the circuit of FIG. 9.

Referring to FIGS. 8 and 10, circuit schematics for the solid state structure of FIG. 7 are shown. In both figures, the parasitic electrical components and a lump impedance representation are shown. Therefore, each parasitic component formed as a result of circuit operation is represented by their well-known circuit symbol and the lumped impedance is depicted by alphabetic character Z with a box around the component or components that are lumped. Thus, in FIG. 8, electrical component L1 has the representation Z1 as its lumped representation and so forth. Likewise, in FIG. 10, L1 (inductor) is the parasitic electrical component and Z1 is the lumped representation. In order to simplify the description, common elements are represented by the same alphanumeric symbol throughout the application. It should also be noted that in FIG. 8, the substrate resistance is very little, substantially 0, and as a result, node ND and node NA which are the substrate nodes are interconnected by a straight line. However, in FIG. 10, the substrate resistance (Rsub) is significant and is represented by a lumped impedance Zsub. As will be explained subsequently, the resistivity of the substrate is partly dependent on the process parameters and as such, one can fabricate a chip with a relatively low substrate resistivity or a relatively high substrate resistivity. Depending on the characteristic of the substrate resistivity, different noise reduction techniques can be used according to the teachings of the present invention.

Figure 6:
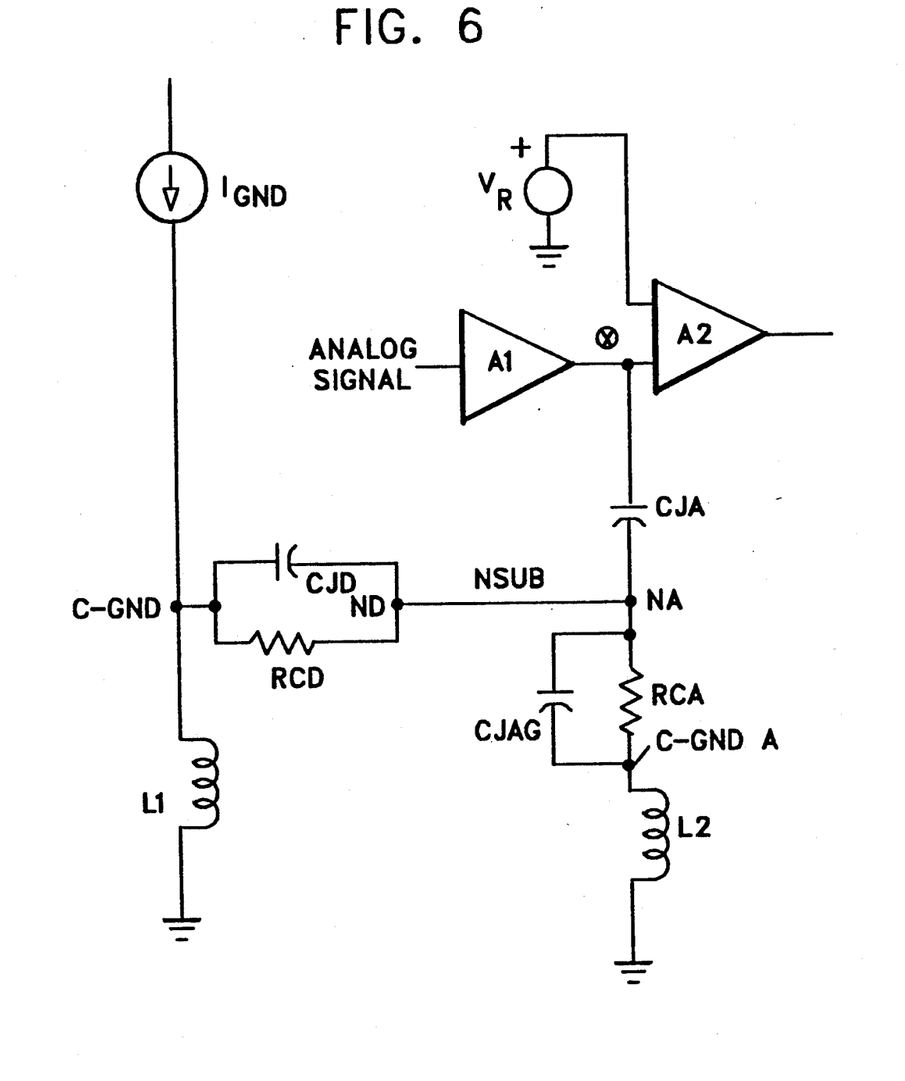
FIG. 6 shows a schematic representation of the substrate network in FIG. 3 with Rsub=0.

In order to understand the magnitude of improvement which applicants' invention provides as opposed to the prior art, it is worthwhile reviewing prior art FIGS. 4, 6 and the present invention shown in FIGS. 8 and 10 respectively. As is shown in the prior art circuit schematic, FIGS. 4 and 6, when the substrate return path and the devices grounding path are tied through a single pin C-GND to card ground, the lead inductance L1 together with the high current ($I_{GND}$) flowing through L1 developed a voltage across L1 which is presented at pin (C-GND). Pin C-GND is coupled through resistor RCD to digital node ND. It should also be noted that pin C-GND is coupled through capacitance CJD to node ND. However, it should be noted that when this chip is operated at its operating frequency within the range of DC to 30 MHZ, a relatively large impedance is generated by the capacitance CJD. Thus, the voltage bounce at C-GND is coupled through the resistance RCD to node ND and through the substrate resistance to node NA and the voltage bounce at node NA results in an error condition within the sensitive analog components in the analog section of the chip.

With reference to applicants' invention schematically shown in FIGS. 8 and 10, the substrate contacts in the digital circuitry have been returned to card ground through a dedicated module pin (or pins) rather than connected to the chip digital ground metal and then to the card ground via the same module pin. With reference to FIGS. 6 (prior art), 8 and 10, it should be noted that Z2X is much greater than Z2 (for the reasons set forth above) and Z4 is parallel to Z3 (is much less than Z3). Also, RCD is less than one ohm and L3 can be made small by paralleling module pins if necessary. Since Z2X is much larger than Z2, more noise will be shunted to ground via Z1 in the configuration shown in FIG. 8 than for the one shown in FIG. 6. Also, since the Z4 and Z3 parallel combination (FIG. 8) impedance is much less than Z3 alone (FIG. 6) the voltage divider formed from $C_D$-GND to card ground will produce a much smaller noise voltage at substrate node ($N_D$) for the circuit of FIG. 8 as opposed to the prior art circuit in FIG. 6. Thus, by designing the logic circuit substrate contacts to be separate from the logic circuit ground return, the noise coupling into the sensitive analog circuit is eliminated or greatly reduced.

FIGS. 9, 9A, 11, 11A and 12 show additional structures and circuit representations for isolating the digital substrate node (ND) from the analog node (NA) by creating an open space or void region 28 between the analog section and the digital section of the chip. As is used herein, the open space or void region means an area in which no switching circuit components are placed. A substrate contact region 30 is positioned in the void region and a metal lead interconnects the substrate contact region to -CARD ground. The preferred position is to place the contact region 30 in the center of the void region 28. The structure is particularly effective for high resistivity substrate.

Figure 11:
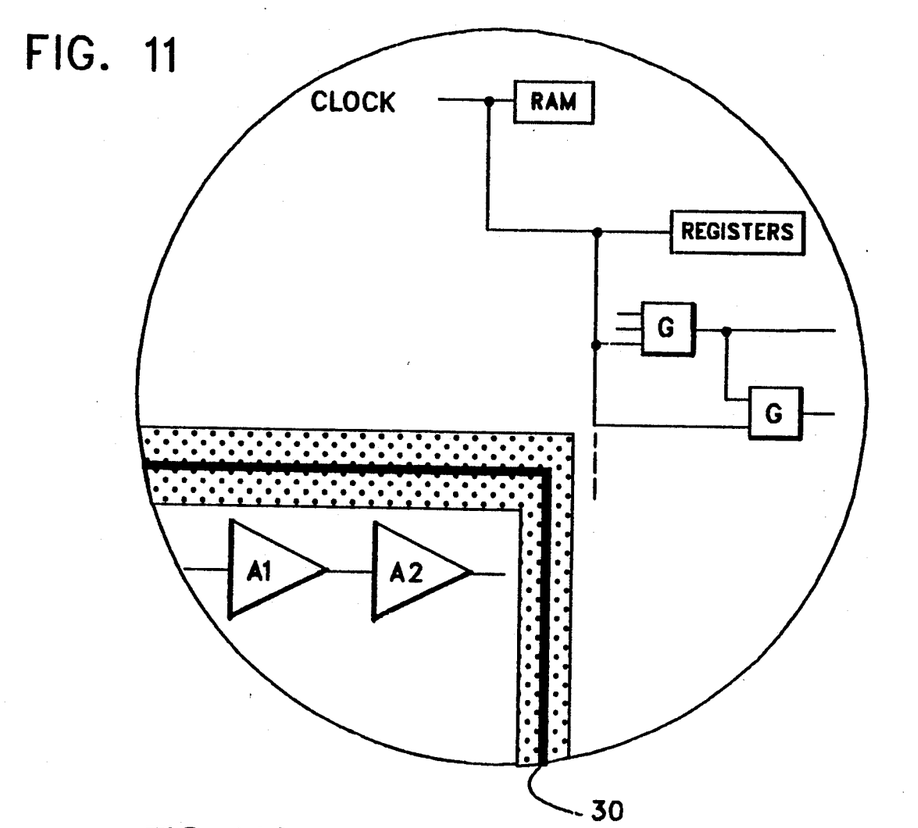
FIG. 11 shows an exploded view of the region circled in FIG. 11A.
Figure 11A:
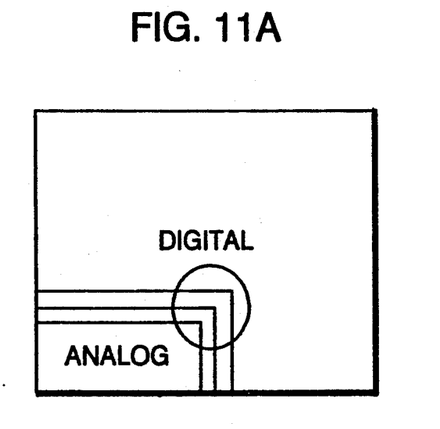
FIG. 11A shows the terrain for a mix circuit, a void region separating the circuit and a contact region within the void region.
Figure 12:
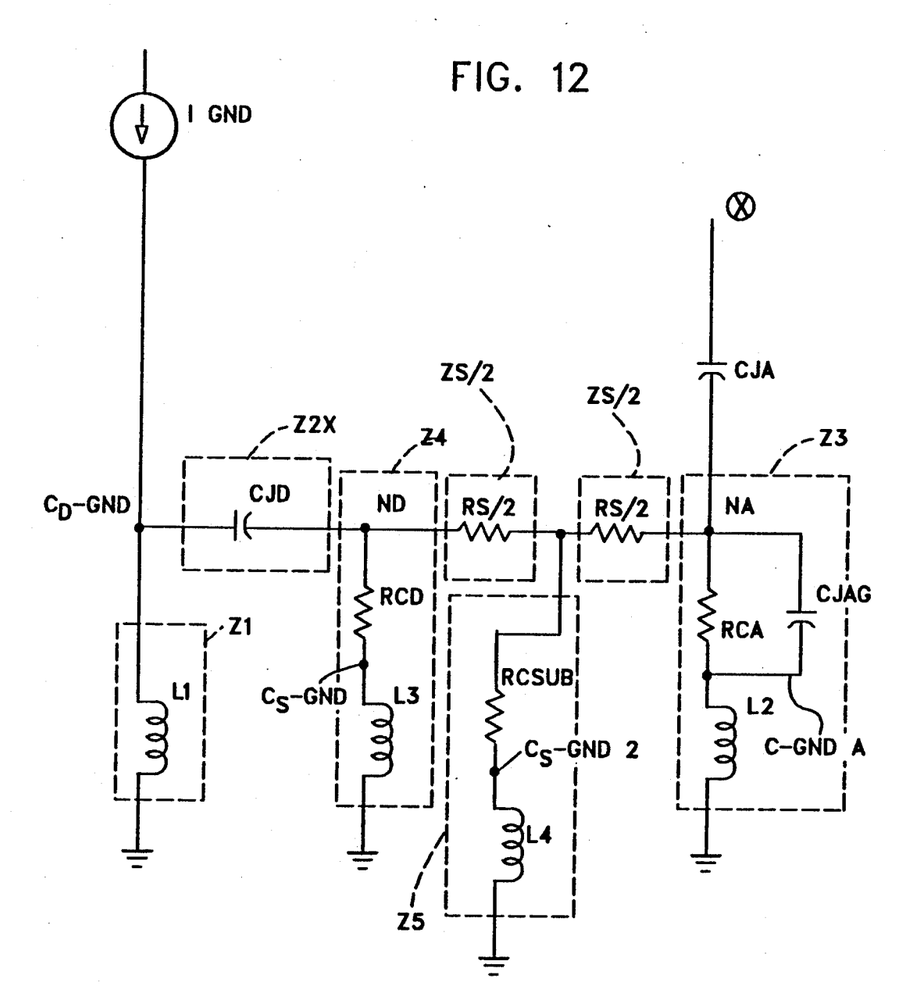
FIG. 12 shows a circuit schematic for the terrain of FIG. 11.

FIG. 12 shows a circuit schematic of the substrate network for the case of a separate substrate ground return, a substrate guard ring and a non-zero R substrate (high resistive substrate). By providing a void region with the substrate contact region about the sensitive analog component on the mixed chip, the voltage divider effect is achieved at the void region and the substrate isolation becomes even more effective. This, of course, requires chip area so a trade-off study on noise performance versus chip area must be made. With reference to FIG. 11, one can see that the most sensitive analog functions are best protected if they are positioned at the edge of the macro farthest from the noise generators. The circuit representation in FIG. 12 is a solid state structure with grounded void region separating the analog and digital circuits. FIG. 8 is a circuit representation in which there is no void region. FIG. 10 is a circuit representation in which the void region does not contain additional substrate contacts. By comparison, it can be seen that the value of the substrate resistance (Rsub) is a function of the space allocated to the circuit void. In addition to designing the logic circuit substrate contacts separated from the logic ground as discussed above, splitting the substrate resistance $Z_{SUB}$ is split in half ($Z_S/2$, FIG. 12) by impedance $Z_S$ provides additional noise immunity into the analog portion of the circuit.

While the invention has been particularly shown and described with reference to the preferred embodiments thereof, it will be understood by those skilled in the art that various changes in form and detail may be made therein without departing from the spirit and scope of the present invention.

What is claimed is:

1. An improved VLSI chip comprising:
   a substrate;
   a plurality of interconnected digital devices which generate digital functions fabricated on said substrate;
   circuit means for generating analog functions fabricated on said substrate;
   at least one device contact are for coupling to at least one digital device fabricated in said substrate;
   a device ground pin ($C_D$-GND) coupled to the chip;
   a first conductive means for forming a device ground return path interconnecting the device ground pin ($C_D$-GND) and the at least one device contact area;
   a substrate contact region fabricated on the substrate;
   a substrate ground pin ($C_S$-GND) coupled to the chip; and
   a second conductive means for forming a substrate ground return path interconnecting the substrate ground pin ($C_S$-GND) and the substrate contact region.

2. The improved VLSI chip of claim 1 further including a card for mounting the chip;

a card ground pin (CARD GND) fabricated on said card; and third conductive means for forming a first chip to card conductive path interconnecting the card ground pin and the device ground pin.

3. The improved VLSI chip of claim 2 further including a fourth conductive means for forming a device ground return path interconnecting the device ground pin ($C_D$-GND) to the card ground pin (CARD GND).

4. The improved VLSI chip of claim 1 further including an area on said chip in which no switching circuit components are fabricated separating the digital devices from the circuit means which generates the analog functions.

5. The improved VLSI chip of claim 4 wherein chip layout is such that the circuit means for generating the analog functions is located on the lower left corner of an analog macro.

6. The improved VLSI chip of claim 4 wherein the a substrate contact region is fabricated in the area.

7. The improved VLSI chip of claim 4 wherein the substrate contact region is positioned in the center of the area.

8. The improved VLSI chip of claim 6 further including a card for mounting the VLSI chip;

a ground pin (CARD GND) fabricated on said card; and a fifth conductive means which establishes a return substrate ground path interconnecting the substrate contact region to the card ground pin.

9. The improved VLSI chip of claim 7 further including a card for mounting the VLSI chip;

a ground pin (CARD GND) fabricated on the card; and a fifth conductive means which establishes a return substrate ground path interconnecting the substrate contact region to the card ground pin.

* * * * *